(12) United States Patent
Zenitani et al.

(10) Patent No.: US 7,449,628 B2
(45) Date of Patent: Nov. 11, 2008

(54) ELECTRIC POWER GENERATION METHOD USING THERMOELECTRIC POWER GENERATION ELEMENT, THERMOELECTRIC POWER GENERATION ELEMENT AND METHOD OF PRODUCING THE SAME, AND THERMOELECTRIC POWER GENERATION DEVICE

(75) Inventors: Yuji Zenitani, Nara (JP); Tsutomu Kanno, Osaka (JP); Hideaki Adachi, Osaka (JP); Yuka Yamada, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/056,003

(22) Filed: Mar. 26, 2008

(65) Prior Publication Data

US 2008/0230107 A1 Sep. 25, 2008

Related U.S. Application Data

(63) Continuation of application No. PCT/JP2007/071795, filed on Nov. 9, 2007.

(30) Foreign Application Priority Data

Mar. 6, 2007 (JP) .............................. 2007-055582

(51) Int. Cl.
  *H01L 35/12* (2006.01)
  *H01L 35/30* (2006.01)
(52) U.S. Cl. ..................................... 136/236.1; 136/205
(58) Field of Classification Search .............. 136/236.1, 136/205
See application file for complete search history.

(56) References Cited

U.S. PATENT DOCUMENTS 5,793,092 A   8/1998   Habermeier et al.
5,922,988 A   7/1999   Nishimoto
6,710,238 B1  3/2004   Shingu et al.

FOREIGN PATENT DOCUMENTS

JP   6-310766   11/1994
JP   8-247851    9/1996

(Continued)

OTHER PUBLICATIONS

Snarskii, A. A., "Anisotropic Thermoelements," Thermoelectrics Handbook: Macro to Nano, 2006, p. 45-1-45-11 Chapter 45, CRC Press.

(Continued)

*Primary Examiner*—Nam X Nguyen
*Assistant Examiner*—Jeffrey T. Barton
(74) *Attorney, Agent, or Firm*—McDermott Will & Emery LLP

(57) ABSTRACT

The present invention provides an electric power generation method using a thermoelectric power generation element, a thermoelectric power generation element, and a thermoelectric power generation device, each of which has high thermoelectric power generation performance and can be used for more applications. The thermoelectric power generation element includes a first electrode and a second electrode that are disposed to oppose each other, and a laminate that is interposed between the first and second electrodes and that is electrically connected to both the first and second electrodes, where the laminate has a structure in which $SrB_6$ layers and metal layers containing Cu, Ag, Au, or Al are laminated alternately, a thickness ratio between the metal layer and the $SrB_6$ layer is in a range of metal layer: $SrB_6$ layer=20:1 to 2.5:1, lamination surfaces of the $SrB_6$ layers and the metal layers are inclined at an inclination angle $\theta$ of 20° to 50° with respect to a direction in which the first electrode and the second electrode oppose each other, and a temperature difference applied in a direction perpendicular to the direction in the element generates a potential difference between the first and second electrodes. The electric power generation method and thermoelectric power generation device each use the element.

24 Claims, 5 Drawing Sheets

FOREIGN PATENT DOCUMENTS

| | | |
|---|---|---|
| JP | 10-032355 | 2/1998 |
| JP | 2004-186241 | 7/2004 |
| WO | WO 00/76006 A1 | 12/2000 |

OTHER PUBLICATIONS

Kyarad, A., et al., "Traverse Peltier effect in tilted Pb-$Bi_2Te_3$ multilayer structures," Applied Physics Letters, Nov. 6, 2006, p. 192103-1-192103-3, vol. 89, No. 19, American Institute of Physics.

ELECTRIC POWER GENERATION METHOD USING THERMOELECTRIC POWER GENERATION ELEMENT, THERMOELECTRIC POWER GENERATION ELEMENT AND METHOD OF PRODUCING THE SAME, AND THERMOELECTRIC POWER GENERATION DEVICE

RELATED APPLICATIONS

This application is a continuation of U.S. National Phase under 35 U.S.C. §371 of International Application No. PCT/JP2007/071795, filed on Nov. 09, 2007, which in turn claims the benefit of Japanese Application No. 2007-055582, filed on Mar. 06, 2007, the disclosures of which Applications are incorporated by reference herein.

BACKGROUND OF THE INVENTION

1. Field of the Invention

The present invention relates to an electric power generation method using a thermoelectric power generation element, which is a method of obtaining electrical energy directly from thermal energy. Furthermore, the present invention also relates to a thermoelectric power generation element that converts thermal energy directly into electrical energy and the method of producing the same, as well as a thermoelectric power generation device.

2. Description of the Related Art

Thermoelectric power generation is a technique for converting thermal energy directly into electrical energy by utilizing the Seebeck effect whereby an electromotive force is generated in proportion to the temperature difference applied to both ends of a material. This technique is used practically in, for example, remote area power supply, space power supply, and military power supply.

A conventional thermoelectric power generation element generally has a structure that is referred to as a so-called "π-type structure", in which a "p-type semiconductor" and an "n-type semiconductor" that are different in carrier sign from each other are combined together thermally in parallel and electrically in series.

Generally, the performance of a thermoelectric material that is used for a thermoelectric power generation element is evaluated by a figure of merit Z or a figure of merit ZT nondimensionalized by multiplying Z by absolute temperature. ZT can be expressed by a formula of $ZT = S^2/\rho\kappa$, where S denotes the Seebeck coefficient of a thermoelectric material, $\rho$ indicates electrical resistivity, and $\kappa$ is thermal conductivity. Furthermore, $S^2/\rho$, which is an index expressed with consideration being given to only the Seebeck coefficient S and electrical resistivity $\rho$, also is referred to as a power factor (output factor) and serves as a criterion for evaluating the power generation performance of a thermoelectric material obtained when the temperature difference is constant.

$Bi_2Te_3$ that currently is used practically as a thermoelectric material has a high thermoelectric power generation performance, specifically, a ZT of approximately 1 and a power factor of about 40 $\mu W/(cm \cdot K^2)$. However, in the case of an element having the aforementioned π-type structure, it is difficult to obtain a high thermoelectric power generation performance. Thus, it has not reached a level that is sufficiently high enough to allow it to be used practically for more various applications. Furthermore, $Bi_2Te_3$ has a problem in heat resistance and therefore the thermoelectric power generation performance thereof deteriorates at temperatures of 100° C. or higher, and further $Bi_2Te_3$ poses a heavy load on the environment since it contains Bi as a constituent element.

In JP 2004-186241 A (Reference 1), boron compounds such as $SrB_6$ are examined as materials for thermoelectric power generation. These boron compounds are chemically very stable under normal temperature and pressure and are stable at temperatures up to around 1000K in the air and up to around 2500K under an atmosphere of an inert gas such as nitrogen. Thus they have excellent heat resistance. Furthermore, the aforementioned compounds are free from constituent elements that pose a heavy load on the environment. However, the boron compounds have a power factor of about 18 $\mu W/(cm \cdot K^2)$. When an element having the above-mentioned π-type structure is formed using one of them, the thermoelectric power generation performance actually obtained from the element further deteriorates, which prevents them from being used practically.

On the other hand, there has been a proposal for an element utilizing anisotropy of the thermoelectric properties in a laminated structure that is naturally-occurring or is produced artificially as an element having a different structure from the π-type structure (Thermoelectrics Handbook, Chapter 45 "Anisotropic Thermoelements", CRC Press (2006): Reference 2). However, according to Reference 2, it is difficult to improve ZT of such an element. Therefore, it is developed not for the use for thermoelectric power generation but for assumed uses mainly in the field of measurement such as an infrared sensor.

Furthermore, JP 6(1994)-310766 A (Reference 3) discloses, as a thermoelectric material having a similar structure thereto, a material in which a material having thermoelectric properties, which is typified by Fe—Si materials, and an insulating material with a thickness of 100 nm or less, which is typified by $SiO_2$, are arranged alternately in the form of stripes on a substrate. According to Reference 3, in a material having such a microstructure, as compared to the case where a Fe—Si material having thermoelectric properties is used independently, the Seebeck coefficient S can be improved but on the other hand, the electrical resistivity $\rho$ increases due to the insulating material contained therein. Accordingly, the element made thereof has increased internal resistance, and the electric power obtained therewith is reduced conversely.

Examples of other thermoelectric materials having laminated structures include a material having a layered body formed of semimetal, metal, or synthetic resin, which is disclosed in WO 00/076006 (Reference 4). This material is based on the configuration in which, as in the case of the conventional π-type structure, a temperature difference is applied to the direction in which the respective layers of the layered body are laminated, and thereby electric power is extracted through a pair of electrodes that are disposed so as to oppose in the same direction as that described above. Therefore the element disclosed in Reference 4 is substantially different from that disclosed in Reference 1.

SUMMARY OF THE INVENTION

As described above, in conventional thermoelectric materials, it is not possible to obtain thermoelectric power generation performance that is sufficiently high enough to allow them to be used practically for more various applications. Furthermore, there are demands for practical application of a thermoelectric power generation element having a thermoelectric material that poses less load on the environment.

The present inventors made studies assiduously with respect to the thermoelectric power generation element formed using a laminate. As a result, they obtained the following unexpected findings to reach the present invention based thereon. That is, a laminate formed of a $SrB_6$ layer (strontium boride) layer and a metal layer containing a specific metal was used, with the thickness ratio between the $SrB_6$ layer and the metal layer being in a specific range, the lamination surfaces of the laminate were inclined at a predetermined inclination angle θ with respect to the direction in which electrodes, between which the laminate was interposed, oppose each other, and thereby, as compared to the case where $SrB_6$ was used independently as a thermoelectric material, the power factor of the element was increased and the thermoelectric power generation characteristics were improved considerably.

That is, an electric power generation method using a thermoelectric power generation element of the present invention is a method for obtaining electric power from the element by applying a temperature difference in the thermoelectric power generation element. In this method, the element includes a first electrode and a second electrode that are disposed to oppose each other, and a laminate that is interposed between the first and second electrodes and that is electrically connected to both the first and second electrodes, the laminate has a structure in which a $SrB_6$ layer and a metal layer containing Cu, Ag, Au, or Al are laminated alternately, a thickness ratio between the metal layer and the $SrB_6$ layer is in a range of metal layer: $SrB_6$ layer=20:1 to 2.5:1, and lamination surfaces of the $SrB_6$ layer and the metal layer are inclined at an inclination angle θ of 20° to 50° with respect to the direction in which the first electrode and the second electrode oppose each other. The method includes a step of applying a temperature difference in the direction perpendicular to the direction in which the first electrode and the second electrode oppose each other in the element, so that electric power is obtained through the first and second electrodes.

The thermoelectric power generation element of the present invention includes a first electrode and a second electrode that are disposed to oppose each other and a laminate that is interposed between the first and second electrodes and that is electrically connected to both the first and second electrodes, where the laminate has a structure in which a $SrB_6$ layer and a metal layer containing Cu, Ag, Au, or Al are laminated alternately, a thickness ratio between the metal layer and the $SrB_6$ layer is in a range of metal layer: $SrB_6$ layer=20:1 to 2.5:1, lamination surfaces of the $SrB_6$ layer and the metal layer are inclined at an inclination angle θ of 20° to 50° with respect to the direction in which the first electrode and the second electrode oppose each other, and a temperature difference applied in the direction perpendicular to the direction in which the first electrode and the second electrode oppose each other in the element generates a potential difference between the first and second electrodes.

A method of producing a thermoelectric power generation element of the present invention is a method of producing a thermoelectric power generation element that includes a first electrode and a second electrode that are disposed to oppose each other and a laminate that is interposed between the first and second electrodes and that is electrically connected to both the first and second electrodes, where the laminate has a structure in which a $SrB_6$ layer and a metal layer containing Cu, Ag, Au, or Al are laminated alternately, a thickness ratio between the metal layer and the $SrB_6$ layer is in a range of metal layer: $SrB_6$ layer=20:1 to 2.5:1, lamination surfaces of the $SrB_6$ layer and the metal layer are inclined at an inclination angle θ of 20° to 50° with respect to the direction in which the first electrode and the second electrode oppose each other, and a temperature difference applied in the direction perpendicular to the direction in which the first electrode and the second electrode oppose each other in the element generates a potential difference between the first and second electrodes, wherein the method includes cutting out an original plate, in which a $SrB_6$ layer and a metal layer containing Cu, Ag, Au, or Al are laminated alternately and a thickness ratio between the metal layer and the $SrB_6$ layer is in a range of metal layer: $SrB_6$ layer=20:1 to 2.5:1, in a direction that obliquely traverses lamination surfaces of the $SrB_6$ layer and the metal layer, and disposing the first and second electrodes on the laminate thus obtained so that the first and second electrodes oppose each other and the direction in which they oppose each other traverses the lamination surfaces at an inclination angle θ of 20° to 50°.

A thermoelectric power generation device of the present invention includes a support plate and a thermoelectric power generation element disposed on the support plate, where the element includes first and second electrodes that are disposed to oppose each other, and a laminate that is interposed between the first and second electrodes and that is electrically connected to both the first and second electrodes, the laminate has a structure in which a $SrB_6$ layer and a metal layer containing Cu, Ag, Au, or Al are laminated alternately, a thickness ratio between the metal layer and the $SrB_6$ layer is in a range of metal layer: $SrB_6$ layer=20:1 to 2.5:1, lamination surfaces of the $SrB_6$ layer and the metal layer are inclined at an inclination angle θ of 20° to 50° with respect to the direction in which the electrodes of a pair oppose each other, the element is disposed on the support plate in such a manner that the direction perpendicular to the direction in which the electrodes of a pair oppose each other agrees with the direction perpendicular to the surface of the support plate on which the element is disposed, and a temperature difference is applied in the direction perpendicular to the surface of the support plate, so that electric power is obtained through the electrodes of a pair.

According to the present invention, as compared to the case where $SrB_6$ is used independently as a thermoelectric material, for example, the case where an element having a π-type structure is formed, higher thermoelectric power generation characteristics can be obtained. Furthermore, the present invention makes it possible to obtain a thermoelectric power generation method, a thermoelectric power generation element, and a thermoelectric power generation device that pose less load on the environment. The present invention improves the efficiency of energy conversion between thermal energy and electrical energy and has an effect of facilitating application of thermoelectric power generation to various fields and thus has an industrially high value.

BEST MODE FOR CARRYING OUT THE INVENTION

<Thermoelectric Power Generation Element>

Figure 1:
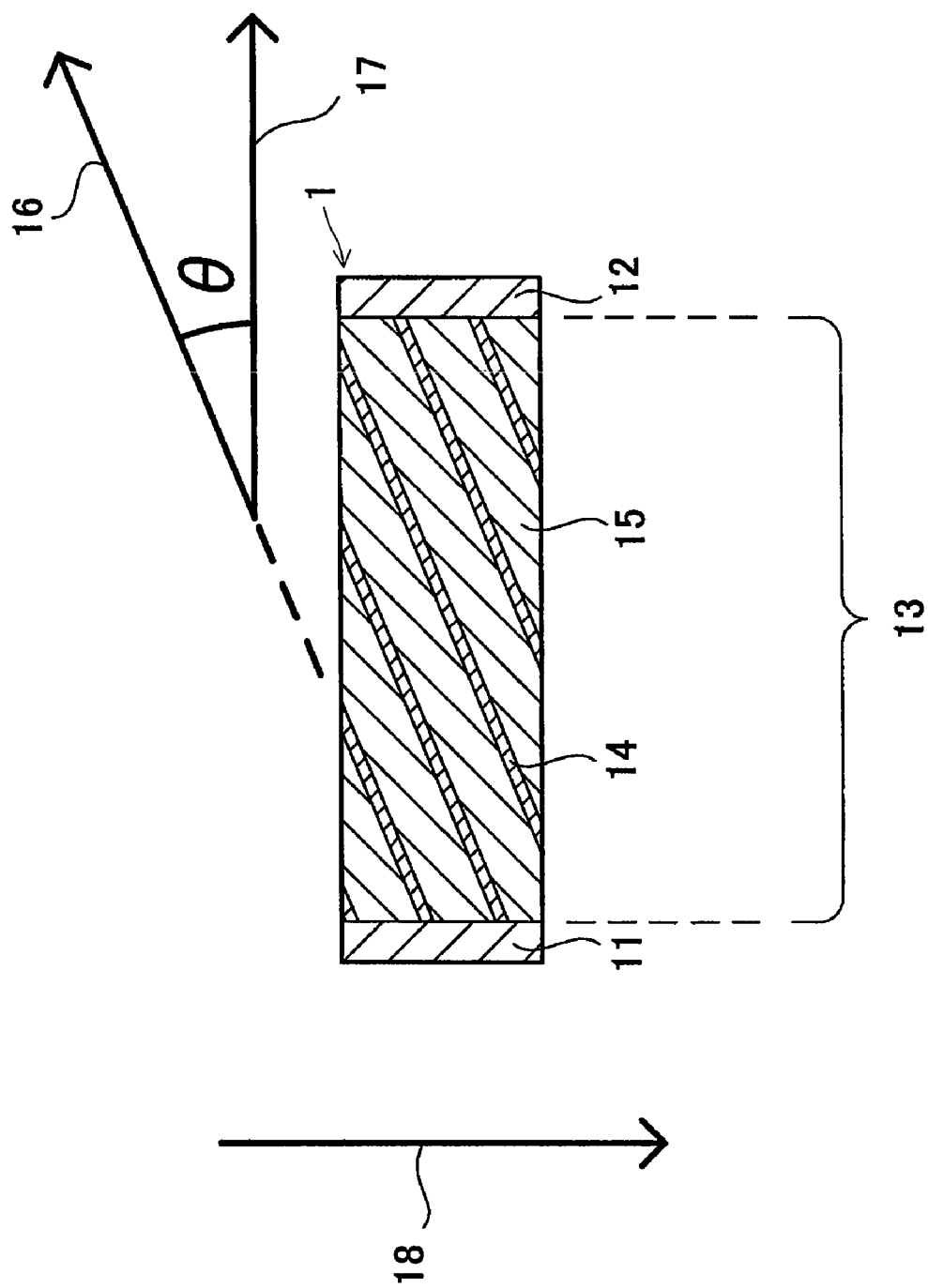
FIG. 1 is a schematic view showing an example of a thermoelectric power generation element according to the present invention as well as the direction in which the first and second electrodes oppose each other, the direction in which a temperature difference is to be applied, and an inclination angle θ.

FIG. 1 shows an example of the thermoelectric power generation element of the present invention. The thermoelectric power generation element 1 shown in FIG. 1 includes a first electrode 11 and a second electrode 12 that are disposed to oppose each other and a laminate 13 that is interposed between the first electrode 11 and the second electrode 12 and is electrically connected to both the electrodes. The laminate 13 is connected to principal surfaces of the first electrode 11 and the second electrode 12, and the principal surfaces of both the electrodes are in parallel with each other. The shape of the laminate 13 shown in FIG. 1 is rectangular parallelepiped, and the first electrode 11 and the second electrode 12 are disposed on a pair of opposing surfaces thereof. The surfaces of the first and second electrodes are orthogonal to the direction (opposing direction 17) in which the first and second electrodes oppose each other.

The laminate 13 has a structure in which $SrB_6$ layers 14 and metal layers 15 containing Cu (copper), Ag (silver), Au (gold), or Al (aluminum) are laminated alternately. The lamination surfaces of the respective layers (the direction 16 that is in parallel with the principal surface of each layer) are inclined at an inclination angle θ of 20° to 50° with respect to the opposing direction 17. The thickness ratio between a metal layer 15 and a $SrB_6$ layer 14 in the laminate 13 is in the range of metal layer: $SrB_6$ layer=20:1 to 2.5:1.

In the element 1, the temperature difference applied in the direction 18 perpendicular to the opposing direction 17 generates a potential difference between the first electrode 11 and the second electrode 12. In other words, a temperature difference is applied in the direction 18 perpendicular to the opposing direction 17 in the element 1, so that electric power can be extracted through the above-mentioned electrodes of a pair (the first electrode 11 and the second electrode 12).

Figure 2:
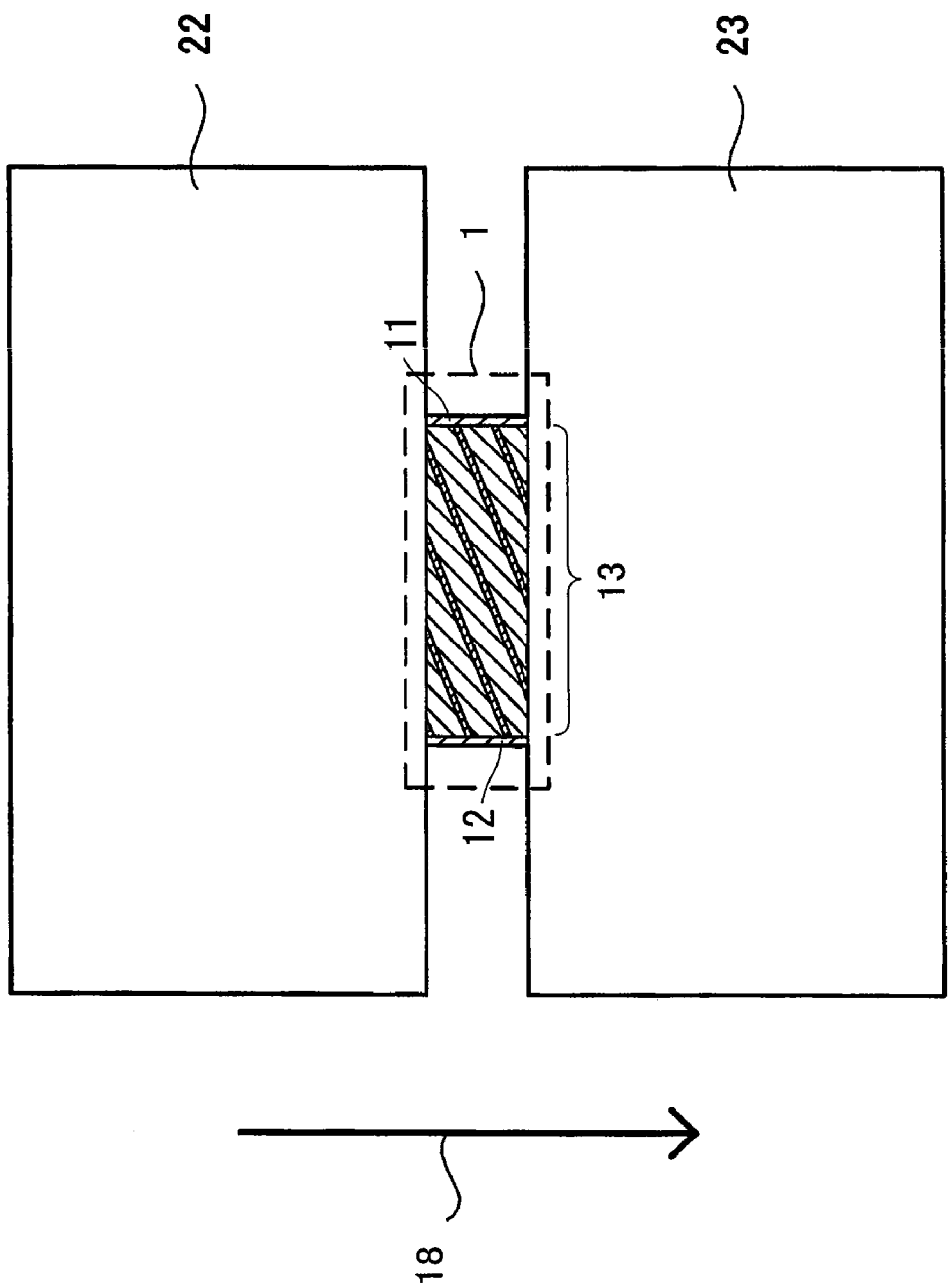
FIG. 2 is a schematic view showing an example of the configuration for driving the thermoelectric power generation element of the present invention.

Specifically, for example, as shown in FIG. 2, a temperature difference is applied to the direction 18 perpendicular to the opposing direction 17 in which the electrodes 11 and 12 oppose each other, with a hot section 22 being attached closely to one surface of the laminate 13 of the element 1 where the electrodes 11 and 12 are not disposed and a cold section 23 being attached closely to the other surface, thereby a potential difference is generated between the electrodes 11 and 12, and thus electric power can be extracted through both the electrodes. On the other hand, in a conventional thermoelectric power generation element having a π-type structure, electromotive force is generated only in the direction parallel to the direction in which the temperature difference is applied and is not generated in the direction perpendicular thereto. Accordingly, in the conventional thermoelectric power generation element, it is necessary to apply a temperature difference between the pair of electrodes, through which electric power is extracted. In the element 1, both the opposing direction 17 in which the first electrode 11 and the second electrode 12 oppose each other and the direction 18 in which the temperature difference is applied traverse the lamination surfaces of the respective layers of the element 13. Furthermore, the direction 18 in which the temperature difference is applied is not limited as long as it is substantially perpendicular to the opposing direction 17 in which the electrodes 11 and 12 oppose each other (similarly in this specification, the term "perpendicular" embraces "substantially perpendicular").

Conventionally, as disclosed in Reference 3, it has been difficult to improve both the Seebeck coefficient S and the electrical resistivity ρ of the thermoelectric material and to increase the power factor of the element. However, in the element 1, as compared to the case where $SrB_6$ is used independently as the thermoelectric material, the power factor of the element can be increased and high thermoelectric power generation characteristics can be obtained.

The element 1 reflects the thermal properties of $SrB_6$ and therefore has excellent heat resistance.

The metal layer 15 contains Cu, Ag, Au, or Al. The metal layer 15 contains preferably Cu, Ag, or Au and particularly preferably Cu or Ag. In this case, higher thermoelectric power generation characteristics can be obtained. The metal layer 15 may contain such metal independently or as an alloy. When the metal layer 15 contains such metal independently, the metal layer 15 is composed of Cu, Ag, Au, or Al, preferably Cu, Ag, or Au, and particularly preferably Cu or Ag.

Preferably, a material with excellent electroconductivity is used for the first electrode 11 and the second electrode 12. For example, it also may be metal such as Cu, Ag, Mo, W, Al, Ti, Cr, Au, Pt, or In, or a nitride or oxide such as TiN, indium tin oxide (ITO), or $SnO_2$. Furthermore, for example, a solder, a silver solder, or an electroconductive paste also can be used for the electrodes.

Although the detail is described in the section of Example, the present inventors studied various conditions and found out that the power factor of the element 1 further was improved and higher thermoelectric power generation characteristics were obtained by controlling the inclination angle θ formed between the lamination surfaces of the respective layers of the laminate 13 and the opposing direction 17 in which the electrodes 11 and 12 oppose each other, and the thickness ratio between the $SrB_6$ layer 14 and the metal layer 15.

The inclination angle θ is preferably 20° to 40° and more preferably 25° to 35°.

The thickness ratio between the metal layer 15 and the $SrB_6$ layer is preferably in the range of metal layer: $SrB_6$ layer=20:1 to 4:1 and more preferably in the range of metal layer: $SrB_6$ layer=10:1 to 4:1.

From the viewpoint of the combination of the inclination angle θ, the type of the metal layer 15, and the thickness ratio, it is more preferable that the inclination angle θ be 20° to 40°, the metal layer 15 contain Cu, Ag, or Au, and the thickness ratio between the metal layer 15 and the $SrB_6$ layer 14 be in the range of metal layer: $SrB_6$ layer=20:1 to 4:1.

From the same viewpoint, it is more preferable that the inclination angle θ be 25° to 35°, the metal layer 15 contain Cu or Ag, and the thickness ratio between the metal layer 15 and the $SrB_6$ layer 14 be in the range of metal layer: $SrB_6$ layer=10:1 to 4:1.

Depending on these conditions, the power factor (output factor) of the element 1 can be at least 30 ($\mu W/(cm \cdot K^2)$), further can be at least 34 ($\mu W/(cm \cdot K^2)$) or at least 40 ($\mu W/(cm \cdot K^2)$).

<Method of Producing Thermoelectric Power Generation Element>

Figure 3:
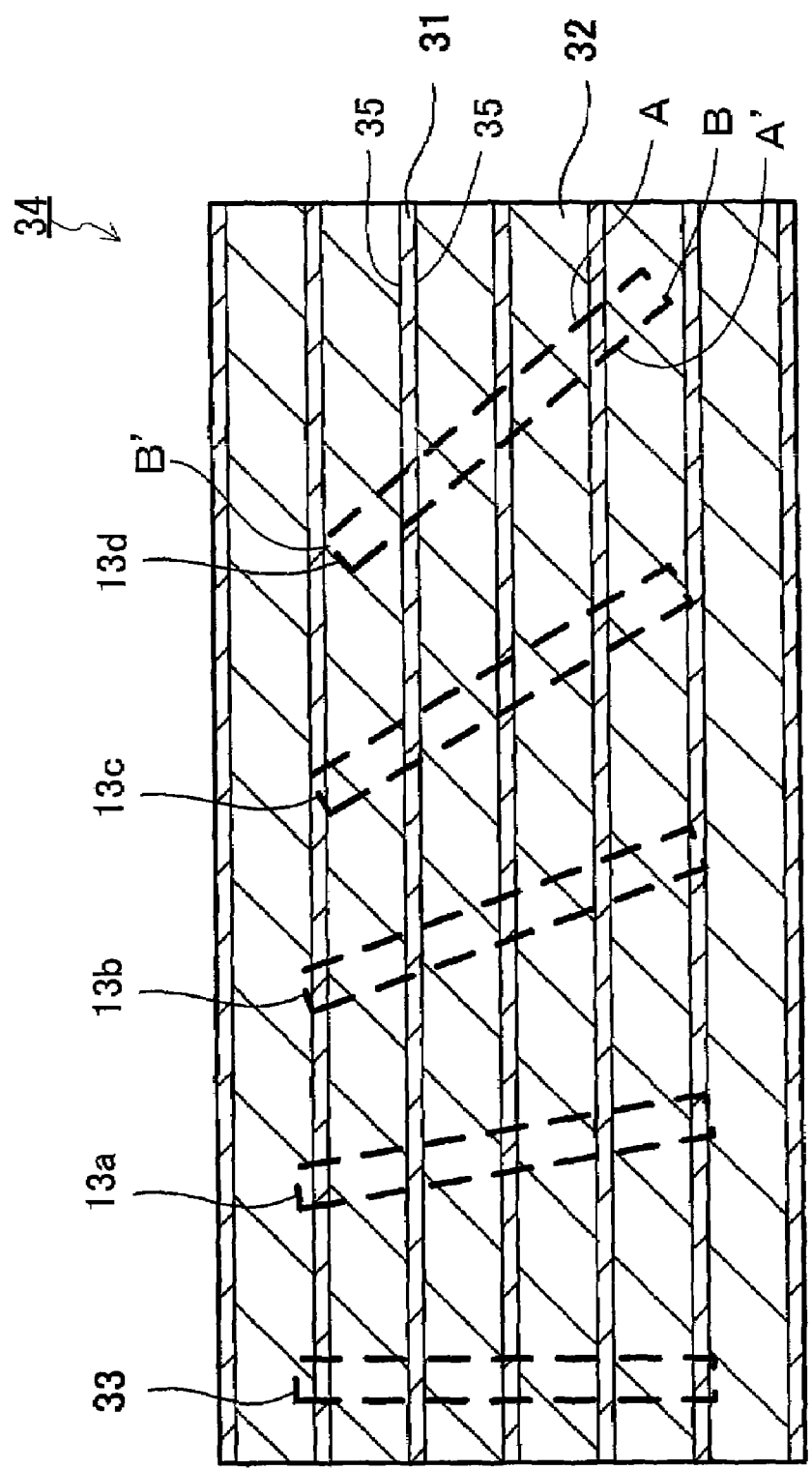
FIG. 3 is a schematic view showing an example of the method of cutting out a laminate from an original plate in a method of producing a thermoelectric power generation element of the present invention.

The thermoelectric power generation element 1 can be formed as follows. That is, for example, as shown in FIG. 3, an original plate (laminated original plate) 34, in which $SrB_6$ films 31 and metal films 32 containing Cu, Ag, Au, or Al are laminated alternately and the thickness ratio between a metal film 32 and a $SrB_6$ film 31 is in the range of metal film: $SrB_6$ film=20:1 to 2.5:1, is cut out in a direction that obliquely traverses the lamination surfaces 35 of the SrB$_6$ films 31 and the metal films 32 (for example, is cut out in such a manner that the angle formed between the cut out face and the lamination surfaces 35 is 20° to 50°), and the first and second electrodes are disposed on the resultant laminate 13 (13*a*, 13*b*, 13*c*, or 13*d*) so as to oppose each other and so that the direction in which they oppose each other traverses the lamination surfaces 35 at an inclination angle θ of 20° to 50°. The member indicated with numeral 33 in FIG. 3 is a laminate 33 that was obtained by cutting out the original plate 34 so as to traverse the lamination surfaces 35 perpendicularly thereto. The thermoelectric power generation element of the present invention cannot be formed from such a laminate. The phrase "the first and second electrodes are disposed so that the direction in which they oppose each other traverses the lamination surfaces 35" denotes that, for example, with respect to the laminate 13*d* shown in FIG. 3, the electrodes are disposed on the side faces A and A' or the side faces B and B'.

The metal film 32 may be formed of metal that is identical to that composing the metal layer 15.

The original plate 34 can be formed by, for example, superimposing SrB$_6$ foils and metal foils alternately and bonding them together under pressure. In this case, the SrB$_6$ foils are formed into SrB$_6$ layers 31 and the metal foils are formed into the metal layers 32. At the time of bonding under pressure, heat may be applied in addition to pressure. When the SrB$_6$ foils are thin, they have low mechanical strength and therefore tend to be damaged. Accordingly, it is preferable that metal foils, each of which has a SrB$_6$ film formed on the surface thereof beforehand, be used and they be bonded together under pressure. In this case, the original plate 34 with fewer defects tends to be obtained. Metal foils, each of which has the SrB$_6$ film formed on only one surface thereof, may be used. However, when using metal foils, each of which has the SrB$_6$ film formed on each surface thereof, the degree of adhesion between the respective layers that compose the original plate 34 can be improved.

Furthermore, for example, the original plate 34 also can be formed by depositing the SrB$_6$ films and the metal films alternately.

Formation of the SrB$_6$ film on the surface of the metal foil and deposition of the SrB$_6$ film and the metal film can be carried out by various thin film forming methods, for example, a sputtering method, an evaporation method, a laser ablation method, a vapor deposition methods including a chemical vapor deposition method, a liquid phase growth method, or a plating method. The thickness ratio between the SrB$_6$ film and the metal film that are formed by any one of the above-mentioned thin film formation techniques may be adjusted by a general method.

The thickness ratio between the metal layer 32 and the SrB$_6$ layer 31 in the original plate 34 is preferably in the range of metal layer: SrB$_6$ layer=20:1 to 4:1 and more preferably in the range of metal layer: SrB$_6$ layer=10:1 to 4:1.

A known method such as a cutting process may be used for cutting out the original plate 34. The surfaces of the laminate 13 obtained by cutting out may be polished if necessary.

When the first and second electrodes are to be disposed, it is not always necessary to dispose the electrodes on the whole surfaces of the laminate 13 on which the electrodes are to be disposed. The electrodes may be disposed on parts of the surfaces of the laminate 13 on which the electrodes are to be disposed.

The method of disposing the first and second electrodes is not particularly limited and various thin film formation techniques such as a sputtering method, an evaporation method, and a vapor growth method, or techniques of applying an electroconductive paste, plating, or spraying can be used. For example, electrodes formed separately may be joined to the laminate 13 with, for example, a solder or a silver solder.

When the first and second electrodes are to be disposed on the laminate 13, it is preferable that the first and second electrodes be disposed so that the direction in which they oppose each other traverses the lamination surfaces 35 of the laminate 13 at an inclination angle of 20° to 40° and more preferably at an inclination angle of 25° to 35°.

<Thermoelectric Power Generation Device>

Figure 4:
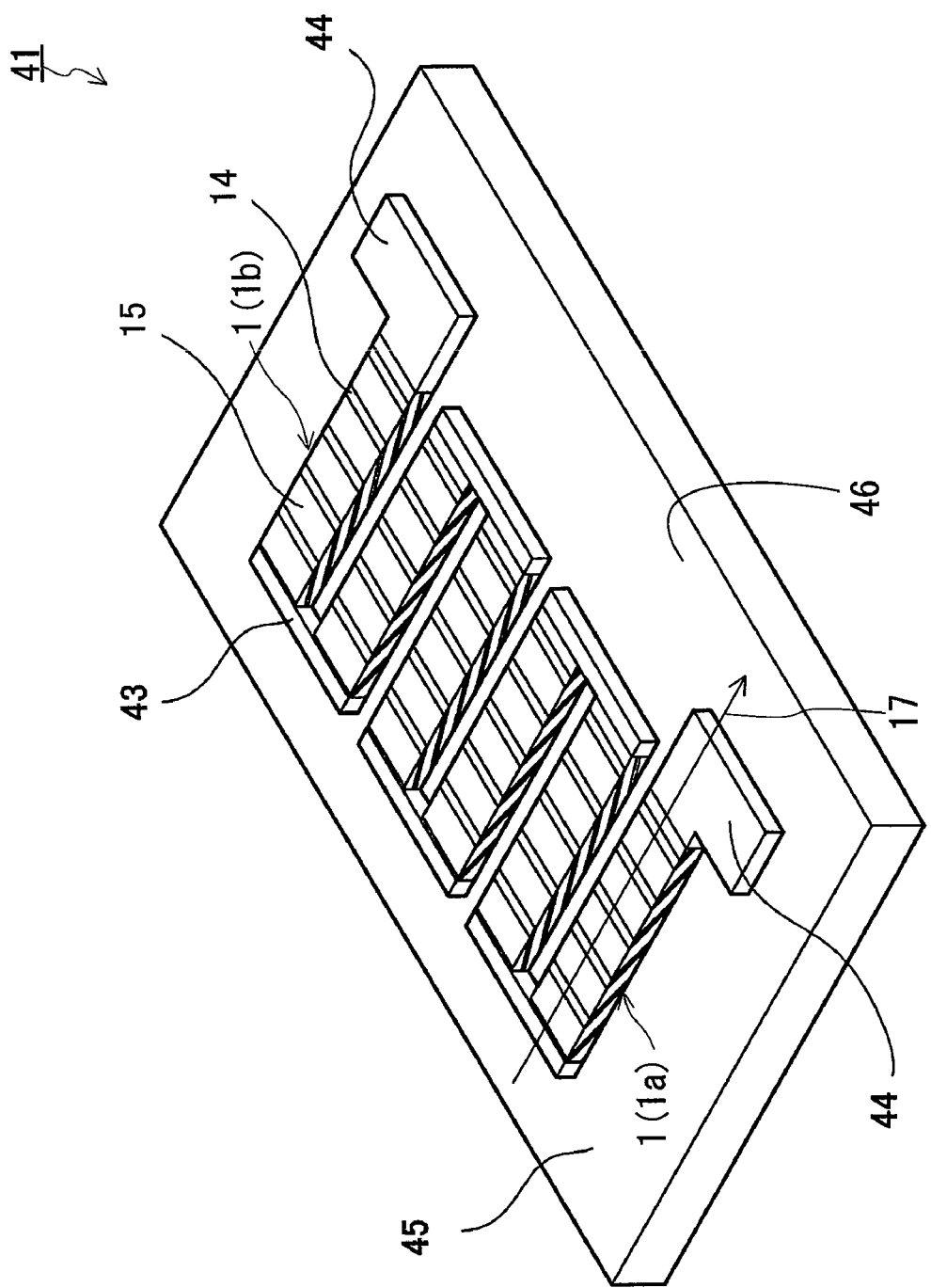
FIG. 4 is a perspective view that schematically shows an example of the thermoelectric power generation device of the present invention.

FIG. 4 shows an example of the thermoelectric power generation device of the present invention. The device 41 shown in FIG. 4 includes a support plate 45 and six thermoelectric power generation elements 1 of the present invention disposed on the support plate 45. Each element 1 is disposed on the support plate 45 in such a manner that the direction perpendicular to the direction 17 in which the first and second electrodes oppose each other in each element agrees with the direction perpendicular to the surface 46 of the support plate 45 on which the elements 1 are disposed. Furthermore, adjacent elements 1 are connected electrically in series with each other through a connecting electrode 43 that also serves as the first or second electrode of each element 1. Extraction electrodes 44, each of which also serves as the first or second electrode, are disposed in elements 1*a* and 1*b* located on the ends of the sequence of the six elements 1.

In the device 41, a temperature difference is allowed to be applied in the direction perpendicular to the surface 46 of the support plate 45. For example, a cold section is brought into contact with the surface of the support plate 45 on which the elements 1 are not disposed, a hot section is brought into contact with the opposite surface to the surface of the element 1 that is in contact with the support plate 45, and thereby electric power can be obtained through the extraction electrodes 44. In the example shown in FIG. 4, in the adjacent elements 1, the directions in which the lamination surfaces of the SrB$_6$ layers and the metal layers are inclined are opposite to each other. This is intended to prevent the electromotive force generated in the elements 1 due to the application of the temperature difference from being cancelled between the adjacent elements 1.

Figure 5:
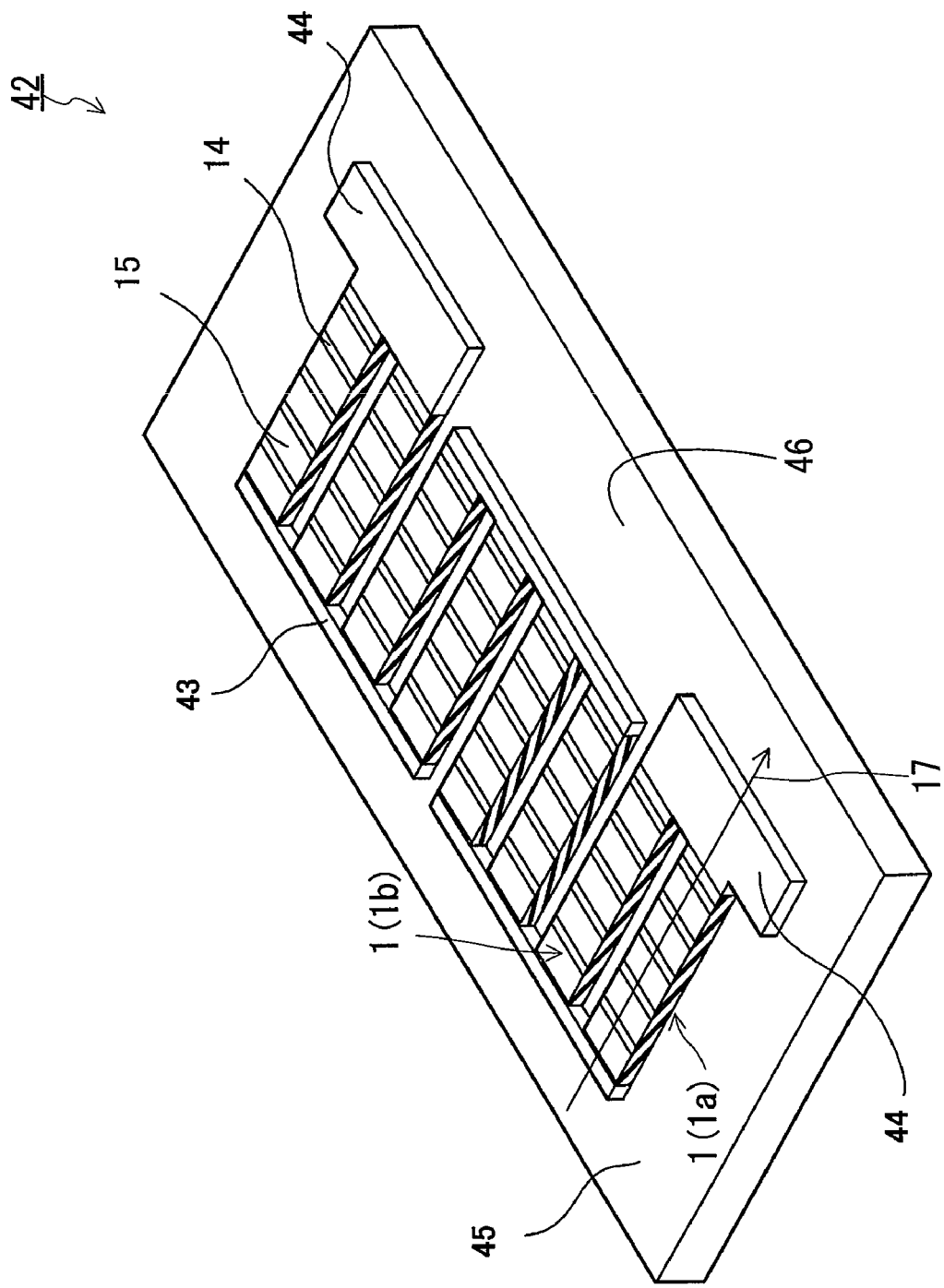
FIG. 5 is a perspective view that schematically shows another example of the thermoelectric power generation device of the present invention.

FIG. 5 shows another example of the thermoelectric power generation device of the present invention. The device 42 shown in FIG. 5 includes a support plate 45 and eight thermoelectric power generation elements 1 of the present invention disposed on the support plate 45. Each element 1 is disposed on the support plate 45 in such a manner that the direction perpendicular to the direction 17 in which the first and second electrodes oppose each other in each element agrees with the direction perpendicular to the surface 46 of the support plate 45 on which the elements 1 are disposed. The eight elements 1 are divided into four blocks that are disposed on the support plate 45, with one block including two elements 1. Elements of one block (for example, element 1*a* and 1*b*) are connected electrically in parallel with each other through a connecting electrode 43 that also serves as the first or second electrode of each element. The blocks adjacent to each other are connected electrically in series through the connecting electrodes 43.

In the device 42, a temperature difference is allowed to be applied in the direction perpendicular to the surface 46 of the support plate 45. For example, a cold section is brought into contact with the surface of the support plate 45 on which the elements 1 are not disposed, a hot section is brought into contact with the opposite surface to the surface of the element 1 that is in contact with the support plate 45, and thereby electric power can be obtained through the extraction electrodes 44. In the example shown in FIG. 5, the directions in which the $SrB_6$ layers and the metal layers are inclined are identical to each other in the elements 1 included in one block, and they are opposite to each other in the adjacent blocks. This is intended to prevent the electromotive force generated in the elements 1 due to the application of the temperature difference (generated in the blocks due to the application of the temperature difference) from being cancelled between the adjacent elements 1 and between the adjacent blocks.

The configuration of the thermoelectric power generation device of the present invention is not limited to the examples shown in FIGS. 4 and 5. For example, one thermoelectric power generation element may be disposed on the support plate. However, when the thermoelectric power generation device is formed with at least two thermoelectric power generation elements being disposed as in the examples shown in FIGS. 4 and 5, more electrical energy can be obtained. Furthermore, as in the example shown in FIG. 4, when the elements are connected electrically in series with each other, the voltage obtained is increased. As in the example shown in FIG. 5, when the elements are connected electrically in parallel with each other, the possibility that the function of the thermoelectric power generation device as a whole can be maintained even in the case where the electrical connection of the elements 1 is lost partially can be increased and thus the reliability of the thermoelectric power generation device can be improved. That is, a suitable combination of the series and parallel connections of the elements makes it possible to configure a thermoelectric power generation device with high thermoelectric power generation characteristics.

The structures of the connecting electrodes 43 and the extraction electrodes 44 are not particularly limited as long as they are excellent in electroconductivity. For example, the connecting electrodes 43 and the extraction electrodes 44 may be formed of metal such as Cu, Ag, Mo, W, Al, Ti, Cr, Au, Pt, or In, or nitride or oxide such as TiN, indium tin oxide (ITO), or $SnO_2$. Furthermore, a solder, a silver solder, or an electroconductive paste also can be used for the electrodes.

<Electric Power Generation Method Using Thermoelectric Power Generation Element>

The electric power generation method of the present invention is a method of obtaining electric power through a first electrode 11 and a second electrode 12 (or connecting electrodes 43 or extraction electrodes 44), by applying a temperature difference in the direction perpendicular to the opposing direction 17 in which the electrodes oppose each other in a thermoelectric power generation element 1 of the present invention described above.

EXAMPLE

Hereinafter, the present invention is described in further detail. The present invention is not limited to the following examples.

Example 1

In Example 1, thermoelectric power generation elements 1 as shown in FIG. 1 were produced using $SrB_6$ and several types of metals (Au, Ag, Cu and Al), and then the thermoelectric power generation characteristics thereof were evaluated.

First, a metal foil (Au foil, Ag foil, Cu foil, or Al foil) with a size of 100 mm×100 mm and a thickness of 20 µm was prepared, and a 2.0-µm thick $SrB_6$ film was formed on each surface of the metal foil by the sputtering method.

Next, a sheet of a $SrB_6$ film/a metal foil/a $SrB_6$ film formed as described above was cut into a size of 50 mm×50 mm to form small strip pieces. Two hundred small pieces thus formed were superimposed together and were subjected to heat pressure bonding at 250° C. for one hour under a reduced pressure of $10^{-4}$Pa while a load of 100 kg/cm² was applied in the direction in which they were laminated. Thereafter, it was subjected to cutting and polishing and thus a laminated original plate with a size of 3 mm×48 mm and a thickness of 20 mm was obtained. The section of the original palate thus obtained was observed with a scanning electron microscope (SEM). As a result, it was observed that metal layers (derived from the metal foils), each of which had a thickness of about 18 µm, and $SrB_6$ layers (derived from $SrB_6$ films), each of which had a thickness of about 2 µm, were laminated alternately. That is, the thickness ratio between the metal layer and the $SrB_6$ layer in the element 1 produced thereby was metal layer: $SrB_6$ layer=9:1.

The laminate 13 with a thickness of 1 mm, a width of 3 mm, and a length of 20 mm was cut out from the original plate obtained as described above by cutting with a diamond cutter as shown in FIG. 3, with the inclination angle θ being changed at 10° intervals from 0° to 90°. Thereafter, a first electrode 11 and a second electrode 12 made of Au were formed, by the sputtering method, on the end faces (corresponding to the side faces B and B' shown in FIG. 3) located in the direction of the long side of each laminate 13 cut out as described above. Thus each thermoelectric power generation element 1 as shown in FIG. 1 was obtained.

Next, as shown in FIG. 2, one surface of the element 1 on which the electrodes were not disposed was heated to 150° C. with a heater and the surface opposing thereto was maintained at 30° C. by water-cooling. Thus, a temperature gradient was applied in the direction perpendicular to the opposing direction 17, and the voltage (electromotive voltage) generated between the electrodes thereby and the electrical resistance value obtained between the electrodes were measured. Thus, the power factor of the element 1 was determined. The direction in which the temperature gradient was applied was the direction that traversed the lamination surfaces of the $SrB_6$ layers and the metal layers in the laminate 13.

Table 1 shows the results of evaluation of the power factors of the respective elements 1 with respect to the change in inclination angle θ in the elements 1 (the elements 1 each have a metal layer of a Au layer, a Ag layer, a Cu layer, or an Al layer according to the type of the metal foil used therefor) formed using the respective metal foils. For example, in an element 1, with a metal layer being a Ag layer and the inclination angle θ being 30°, the electromotive voltage was 47 mV and the electrical resistance value was 0.07 mΩ. The power factor determined from those values was 43 (µW/(cm·K²)).

TABLE 1

[Change in power factor (µW/(cm · K²)) of elements according to inclination angle θ]

| | Inclination angle θ (°) | | | | | | | | | |
|---|---|---|---|---|---|---|---|---|---|---|
| | 0 | 10 | 20 | 30 | 40 | 50 | 60 | 70 | 80 | 90 |
| Au | 0 | 14 | 28 | 31 | 27 | 20 | 12 | 6 | 2 | 0 |
| Ag | 0 | 23 | 41 | 43 | 36 | 27 | 16 | 8 | 2 | 0 |
| Cu | 0 | 21 | 38 | 40 | 34 | 25 | 16 | 7 | 2 | 0 |
| Al | 0 | 10 | 22 | 25 | 22 | 16 | 10 | 5 | 1 | 0 |

As shown in Table 1, the power factor was not obtained with respect to the elements with inclination angles θ of 0° and 90°, i.e. the elements in which the lamination surfaces of the $SrB_6$ layers and the metal layers were in parallel with or orthogonal to the direction in which the first and second electrodes opposed each other. On the other hand, the power factors were obtained with respect to the elements with inclination angles θ other than 0° and 90°, i.e. the elements in which the lamination surfaces of the $SrB_6$ layers and the metal layers were inclined with respect to the direction in which the first and second electrodes opposed each other. With respect to the elements with inclination angles θ of 20° to 50°, high power factors were obtained, specifically, it was at least 16 ($\mu W/(cm \cdot K^2)$) when the metal forming the metal layers was Al, at least 20 ($\mu W/(cm \cdot K^2)$) when the metal forming the metal layers was Au, at least 25 ($\mu W/(cm \cdot K^2)$) when the metal forming the metal layers was Cu, and at least 27 ($\mu W/(cm \cdot K^2)$) when the metal forming the metal layers was Ag.

Furthermore, when the inclination angle θ was 20° to 40°, higher power factors were obtained. Specifically, power factors as high as at least 27 ($\mu W/(cm \cdot K^2)$) when the metal forming the metal layers was Au, Ag, or Cu, and at least 34 ($\mu W/(cm \cdot K^2)$), in some cases, at least 40 ($\mu W/(cm \cdot K^2)$) when the metal forming the metal layers was Ag or Cu were obtained.

Example 2

In Example 2, Ag or Cu was used as the metal for forming a metal layer and elements with different thickness ratios between the metal layer and the $SrB_6$ layer from one another were produced in the same manner as in Example 1. While the inclination angle θ was fixed at 30°, the thickness of the metal foil used for forming the element was changed to 40 μm, 50 μm, 60 μm, 70 μm, 80 μm, 90 μm, 95 μm, 98 μm, and 99 μm, and the elements were formed so that the lamination cycle of the metal layer and the $SrB_6$ layer was 100 μm. The thickness ratios of the $SrB_6$ layers to the laminates of the elements thus formed were 60%, 50%, 40%, 30%, 20%, 10%, 5%, 2%, and 1%, respectively.

With respect to the elements thus produced, the power factors thereof were evaluated in the same manner as in Example 1. The results thereof are indicated in Table 2.

TABLE 2

[Change in power factor ($\mu W/(cm \cdot K^2)$) of elements according to thickness ratio of $SrB_6$ layer to laminate]

| | Thickness ratio of $SrB_6$ layer to laminate (%) | | | | | | | | |
|---|---|---|---|---|---|---|---|---|---|
| | 60 | 50 | 40 | 30 | 20 | 10 | 5 | 2 | 1 |
| Ag | 19 | 22 | 26 | 31 | 37 | 43 | 36 | 18 | 7 |
| Cu | 19 | 21 | 25 | 30 | 36 | 40 | 33 | 16 | 6 |

As indicated in Table 2, when the thickness ratio of the $SrB_6$ layer to the laminate was in the range of 5% to 30%, specifically in the range of 5% to 20%, and particularly in the range of 10% to 20%, high power factors were obtained. When the thickness ratio was 10%, the highest power factor was obtained. This trend was the same in both cases where the metal forming the metal layers was Ag and where it was Cu.

Example 3

In Example 3, while Cu was used as the metal for forming the metal layers, and elements that were different in the thickness ratio between the metal layer and the $SrB_6$ layer and inclination angle θ from one another were produced in the same manner as in Example 1. The inclination angle θ was changed at 5° intervals from 10° to 50°, the thickness of each Cu foil used for forming the elements was fixed at 20 μm, the thickness of the $SrB_6$ film formed on the surface of the Cu foil was changed to 0.25 μm, 0.5 μm, 1 μm, 2 μm, 4 μm, and 8 μm. Thus elements were formed.

With respect to the elements thus produced, the power factors thereof were evaluated in the same manner as in Example 1. The results are shown in Table 3 below.

TABLE 3

[Change in power factor ($\mu W/(cm \cdot K^2)$) of element in terms of inclination angle θ and thickness ratio of $SrB_6$ layer to laminate: metal forming metal layer (thickness of 20 μm) was Cu]

| | | Inclination angle θ | | | | | | | | |
|---|---|---|---|---|---|---|---|---|---|---|
| | | 10 | 15 | 20 | 25 | 30 | 35 | 40 | 45 | 50 |
| Thickness of $SrB_6$ film when laminate was formed (μm)/ Thickness ratio of $SrB_6$ layer to laminate (%) | 8 (μm)/ 29 (%) | 23 | 30 | 32 | 32 | 30 | 28 | 25 | 18 | 18 |
| | 4 (μm)/ 17 (%) | 24 | 34 | 38 | 39 | 38 | 35 | 31 | 27 | 23 |
| | 2 (μm)/ 9 (%) | 20 | 31 | 38 | 40 | 40 | 38 | 34 | 30 | 25 |
| | 1 (μm)/ 5 (%) | 13 | 22 | 29 | 32 | 33 | 32 | 30 | 27 | 23 |
| | 0.5 (μm)/ 2 (%) | 4 | 8 | 11 | 14 | 16 | 16 | 16 | 14 | 13 |
| | 0.25 (μm)/ 1 (%) | 1 | 3 | 4 | 5 | 6 | 7 | 7 | 7 | 6 |

As indicated in Table 3, when the inclination angle θ was 20° to 50° and the thickness of the $SrB_6$ film was in the range of 1 to 8 μm, particularly in the range of 1 to 4 μm, high power factors were obtained. Particularly, when the thickness of the $SrB_6$ film was 2 μm (the thickness ratio between the Cu layer and the $SrB_6$ layer in lamination period of the element was 10:1), the highest power factor was obtained.

Furthermore, when the results of this example is considered together with those of Example 2, it is conceivable that the thermoelectric power generation characteristics of the elements depend considerably on the thickness ratio between the metal layer and the $SrB_6$ layer rather than the absolute values of their thicknesses. With respect to the inclination angle θ, high power factors, specifically, at least 34 $\mu W/(cm \cdot K^2)$ and at least 38 $\mu W/(cm \cdot K^2)$ were obtained in the ranges of 20° to 40° and 25° to 35°, respectively (in both cases, the aforementioned thickness ratio was 10:1). In these cases, high thermoelectric power generation characteristics obtained thereby were approximately at least twice those obtained when $SrB_6$ was used independently as the thermoelectric material.

As described above, the present invention makes it possible to obtain higher thermoelectric power generation characteristics as compared to the case where $SrB_6$ is used independently as a thermoelectric material, for example, the case where an element having a π-type structure is formed. Furthermore, the present invention makes it possible to obtain a thermoelectric power generation method, a thermoelectric power generation element, and a thermoelectric power generation device that pose less load on the environment. The present invention improves the efficiency of energy conversion between thermal energy and electrical energy and has an effect of facilitating application of thermoelectric power generation to various fields and thus has an industrially high value.

Examples of promising applications include an electric generator that utilizes exhaust gas heat from automobiles or factories, and a small portable electric generator.

The present invention may be embodied in other forms without departing from the spirit and essential characteristics thereof. The embodiments disclosed in this specification are to be considered in all respects as illustrative and not limiting. The scope of the present invention is indicated by the appended claims rather than by the foregoing description, and all changes that come within the meaning and range of equivalency of the claims are intended to be embraced therein.

What is claimed is:

1. An electric power generation method using a thermoelectric power generation element for obtaining electric power from the element by applying a temperature difference in the thermoelectric power generation element,
   wherein the element comprises a first electrode and a second electrode that are disposed to oppose each other, and
   a laminate that is interposed between the first and second electrodes and that is electrically connected to both the first and second electrodes,
   the laminate having a structure in which a $SrB_6$ layer and a metal layer containing Cu, Ag, Au, or Al are laminated alternately,
   a thickness ratio between the metal layer and the $SrB_6$ layer being in a range of metal layer: $SrB_6$ layer=20:1 to 2.5:1, and
   lamination surfaces of the $SrB_6$ layer and the metal layer being inclined at an inclination angle θ of 20° to 50° with respect to a direction in which the first electrode and the second electrode oppose each other,
   the method comprising applying a temperature difference in a direction perpendicular to the direction in which the first electrode and the second electrode oppose each other in the element, so that electric power is obtained through the first and second electrodes.

2. The electric power generation method using a thermoelectric power generation element according to claim 1, wherein the inclination angle θ of the lamination surfaces with respect to the direction is 20° to 40°.

3. The electric power generation method using a thermoelectric power generation element according to claim 1, wherein the inclination angle θ of the lamination surfaces with respect to the direction is 25° to 35°.

4. The electric power generation method using a thermoelectric power generation element according to claim 1, wherein the metal layer contains Cu, Ag, or Au.

5. The electric power generation method using a thermoelectric power generation element according to claim 1, wherein the metal layer contains Cu or Ag.

6. The electric power generation method using a thermoelectric power generation element according to claim 1, wherein the thickness ratio between the metal layer and the $SrB_6$ layer is in a range of metal layer: $SrB_6$ layer=20:1 to 4:1.

7. The electric power generation method using a thermoelectric power generation element according to claim 1, wherein the thickness ratio between the metal layer and the $SrB_6$ layer is in a range of metal layer: $SrB_6$ layer=10:1 to 4:1.

8. The electric power generation method using a thermoelectric power generation element according to claim 1, wherein the element has a power factor of at least 30 μW/(cm·$K^2$).

9. The electric power generation method using a thermoelectric power generation element according to claim 2, wherein the metal layer contains Cu, Ag, or Au, and the thickness ratio between the metal layer and the $SrB_6$ layer is in a range of metal layer: $SrB_6$ layer=20:1 to 4:1.

10. The electric power generation method using a thermoelectric power generation element according to claim 3, wherein the metal layer contains Cu or Ag, and the thickness ratio between the metal layer and the $SrB_6$ layer is in a range of metal layer: $SrB_6$ layer=10:1 to 4:1.

11. A thermoelectric power generation element, comprising:
    a first electrode and a second electrode that are disposed to oppose each other, and
    a laminate that is interposed between the first and second electrodes and that is electrically connected to both the first and second electrodes,
    wherein the laminate has a structure in which a $SrB_6$ layer and a metal layer containing Cu, Ag, Au, or Al are laminated alternately,
    wherein a thickness ratio between the metal layer and the $SrB_6$ layer is in a range of metal layer: $SrB_6$ layer=20:1 to 2.5:1,
    wherein lamination surfaces of the $SrB_6$ layer and the metal layer are inclined at an inclination angle θ of 20° to 50° with respect to a direction in which the first electrode and the second electrode oppose each other, and
    wherein the element is configured to generate a potential difference between the first and second electrodes when a temperature difference is applied in a direction perpendicular to the direction in which the first electrode and the second electrode oppose each other.

12. The thermoelectric power generation element according to claim 11, wherein the inclination angle θ of the lamination surfaces with respect to the direction is 20° to 40°.

13. The thermoelectric power generation element according to claim 11, wherein the inclination angle θ of the lamination surfaces with respect to the direction is 25° to 35°.

14. The thermoelectric power generation element according to claim 11, wherein the metal layer contains Cu, Ag, or Au.

15. The thermoelectric power generation element according to claim 11, wherein the metal layer contains Cu or Ag.

16. The thermoelectric power generation element according to claim 11, wherein the thickness ratio between the metal layer and the $SrB_6$ layer is in a range of metal layer: $SrB_6$ layer=20:1 to 4:1.

17. The thermoelectric power generation element according to claim 11, wherein the thickness ratio between the metal layer and the $SrB_6$ layer is in a range of metal layer: $SrB_6$ layer=10:1 to 4:1.

18. The thermoelectric power generation element according to claim 11, wherein the element has a power factor of at least 30 μW/(cm·$K^2$).

19. The thermoelectric power generation element according to claim 12, wherein the metal layer contains Cu, Ag, or Au, and
    the thickness ratio between the metal layer and the $SrB_6$ layer is in a range of metal layer: $SrB_6$ layer=20:1 to 4:1.

20. The thermoelectric power generation element according to claim 13, wherein the metal layer contains Cu or Ag, and
    the thickness ratio between the metal layer and the $SrB_6$ layer is in a range of metal layer: $SrB_6$ layer=10:1 to 4:1.

21. A method of producing a thermoelectric power generation element, the element comprising:
    a first electrode and a second electrode that are disposed to oppose each other, and a laminate that is interposed between the first and second electrodes and that is electrically connected to both the first and second electrodes, wherein the laminate has a structure in which a $SrB_6$ layer and a metal layer containing Cu, Ag, Au, or Al are laminated alternately, wherein a thickness ratio between the metal layer and the $SrB_6$ layer is in a range of metal layer: $SrB_6$ layer=20:1 to 2.5:1, wherein lamination surfaces of the $SrB_6$ layer and the metal layer are inclined at an inclination angle $\theta$ of 20° to 50° with respect to a direction in which the first electrode and the second electrode oppose each other, and wherein the element is configured to generate a potential difference between the first and second electrodes when a temperature difference is applied in a direction perpendicular to the direction in which the first electrode and the second electrode oppose each other, wherein the method comprises providing an original plate having a $SrB_6$ layer and a metal layer containing Cu, Ag, Au, or Al laminated alternately with a thickness ratio between the metal layer and the $SrB_6$ layer being in the range of metal layer: $SrB_6$ layer=20:1 to 2.5:1; cutting the original plate in a direction that obliquely traverses lamination surfaces of the $SrB_6$ layer and the metal layer to obtain the laminate; and disposing the first and second electrodes on the laminate so that the first and second electrodes oppose each other in a direction that is inclined at an inclination angle $\theta$ of 20° to 50° with respect to the lamination surfaces of the $SrB_6$ layer and the metal layer.

22. A thermoelectric power generation device, comprising:
a support plate and a thermoelectric power generation element disposed on the support plate,
wherein the element includes first and second electrodes that are disposed to oppose each other, and a laminate that is interposed between the first and second electrodes and that is electrically connected to both the first and second electrodes, the laminate having a structure in which a $SrB_6$ layer and a metal layer containing Cu, Ag, Au, or Al are laminated alternately, a thickness ratio between the metal layer and the $SrB_6$ layer being in a range of metal layer: $SrB_6$ layer=20:1 to 2.5:1, lamination surfaces of the $SrB_6$ layer and the metal layer being inclined at an inclination angle $\theta$ of 20° to 50° with respect to a direction in which the first electrode of the second electrode oppose each other, wherein the element is disposed on the support plate in such a manner that a direction perpendicular to the direction in which the first electrode and the second electrode oppose each other is the same as a direction perpendicular to a surface of the support plate on which the element is disposed, and wherein the device is configured such that electric power is obtained through the first and second electrodes when a temperature difference is applied in the direction perpendicular to the surface of in support plate.

23. The thermoelectric power generation device according to claim 22, wherein the device includes at least two elements, each of which is identical to the thermoelectric power generation element, and
the elements are connected electrically in series with each other through the electrodes.

24. The thermoelectric power generation device according to claim 22, wherein the device includes at least two elements, each of which is identical to the thermoelectric power generation element, and
the elements are connected electrically in parallel with each other through the electrodes.

* * * * *